United States Patent
Arora

(10) Patent No.: US 7,279,928 B2
(45) Date of Patent: Oct. 9, 2007

(54) XB/YB CODER PROGRAMMED WITHIN AN EMBEDDED ARRAY OF A PROGRAMMABLE LOGIC DEVICE

(75) Inventor: Mohit Arora, Haryana (IN)

(73) Assignee: Avago Technologies General IP Pte. Ltd, Singapore (SG)

( * ) Notice: Subject to any disclaimer, the term of this patent is extended or adjusted under 35 U.S.C. 154(b) by 122 days.

(21) Appl. No.: 11/242,689

(22) Filed: Oct. 4, 2005

(65) Prior Publication Data

US 2007/0075735 A1    Apr. 5, 2007

(51) Int. Cl.
*H03K 19/173* (2006.01)
(52) U.S. Cl. .......................... 326/38; 326/41
(58) Field of Classification Search ............. 326/37–41
See application file for complete search history.

(56) References Cited

U.S. PATENT DOCUMENTS

| 6,911,841 B2* | 6/2005 | Lee et al. ...................... 326/38 |
| 6,911,921 B2 | 6/2005 | Widmer |
| 6,914,545 B1* | 7/2005 | Zaidi ............................ 341/59 |
| 7,024,653 B1* | 4/2006 | Moore et al. .................. 716/16 |
| 7,158,057 B1* | 1/2007 | Zaidi ............................ 341/55 |
| 7,183,797 B2* | 2/2007 | Venkata et al. ............... 326/38 |
| 2004/0233075 A1 | 11/2004 | Park et al. |

OTHER PUBLICATIONS

Xilinx, 8b/10b Encoder v5.0, DS254 May 21, 2004.
Xilinx/ XC4000E Select-RAM: Maximum Configurability, XBRF 003 Jul. 11, 1996.
Alcatel, Implementing an 8b/10b Encoder/Decoder for Gigabit Ethernet in an Actel SX FPGA Family, Oct. 1998.

* cited by examiner

Primary Examiner—Don Le

(57) ABSTRACT

A programmable logic device (PLD) with logic blocks and an embedded array block includes an x-bit (xB)/y-bit (yB) coder programmed into the embedded array block instead of into the logic blocks. An xB/yB coder programmed into an embedded array block of a PLD instead of into logic blocks utilizes less space in a PLD than an xB/yB encoder programmed into the logic blocks. Additionally, the xB/yB coder can operate without row or column crossing for efficient timing in high-speed applications. In an embodiment, the xB/yB coder is an 8B/10B coder. In a further embodiment, the 8B/10B coder comprises a 5B/6B encoder and a 3B/4B encoder.

20 Claims, 4 Drawing Sheets

XB/YB CODER PROGRAMMED WITHIN AN EMBEDDED ARRAY OF A PROGRAMMABLE LOGIC DEVICE

BACKGROUND OF THE INVENTION

A programmable logic device (PLD), such as a field programmable gate array (FPGA), includes logic that can be programmed as needed to set the functionality of the device. A typical FPGA includes logic blocks, row and column interconnects, and input/output (I/O) elements. The logic blocks include programmable circuitry that is programmed to perform certain functions. Some FPGAs also include blocks of random access memory (RAM) that are provided for the sole purpose of memory. Other FPGAs include embedded array blocks (EABs) that include flexible blocks of circuits that can be programmed as memory and/or functional logic.

The programmed logic of an FPGA resides in the logic blocks. Even in FPGAs that include an embedded array block, logic is programmed by default into the logic blocks unless specifically directed to an embedded array block.

FPGAs can be programmed to perform many different functions. A common function that is used in communications applications is 8B/10B encoding/decoding. In FPGAs with embedded array blocks, the logic for an 8B/10B encoder/decoder is programmed by default into the logic blocks. Although an FPGA is able to accommodate an 8B/10B encoder/decoder in the logic blocks, once the resources of an FPGA are fully utilized, additional PLDs must be added to support any additional functionality.

SUMMARY OF THE INVENTION

In accordance with the invention, a PLD with logic blocks and an embedded array block includes an x-bit (xB)/y-bit (yB) coder programmed into the embedded array block instead of into the logic blocks. An xB/yB coder programmed into an embedded array block of a PLD instead of into logic blocks utilizes less space in a PLD than an xB/yB encoder programmed into the logic blocks. Additionally, the capacity of embedded array blocks enables the xB/yB coder to operate without row or column crossing for efficient timing in high-speed applications. In an embodiment, the xB/yB coder is an 8B/10B coder. In a further embodiment, the 8B/10B coder comprises a 5B/6B encoder and a 3B/4B encoder.

Other aspects and advantages of the present invention will become apparent from the following detailed description, taken in conjunction with the accompanying drawings, illustrated by way of example of the principles of the invention.

BRIEF DESCRIPTION OF THE DRAWINGS

Throughout the description similar reference numbers may be used to identify similar elements.

DETAILED DESCRIPTION

Figure 1:
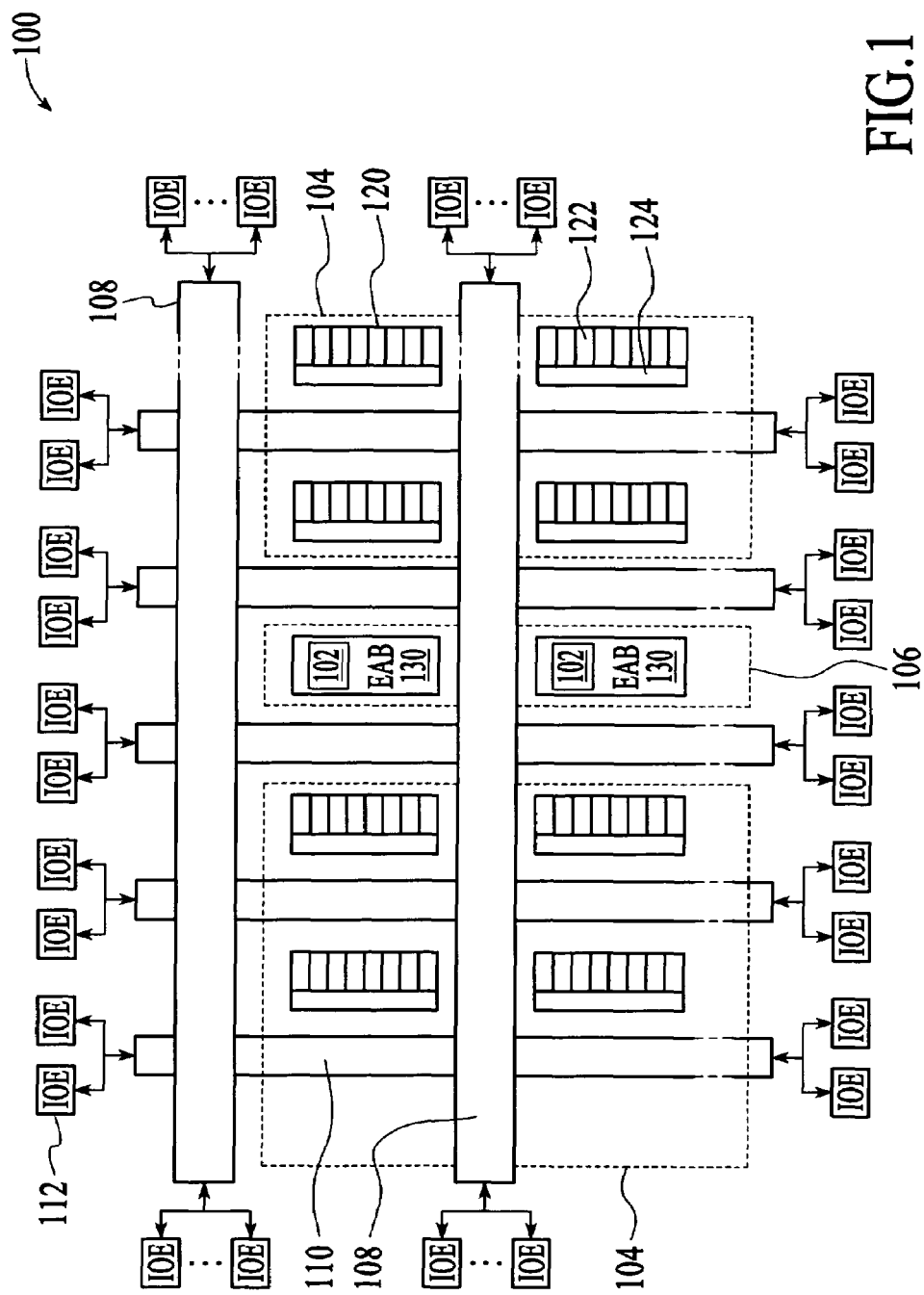
FIG. 1 depicts an embodiment of a PLD that is programmed with an 8-bit (8B)/10-bit (10B) coder in accordance with the invention.

FIG. 1 depicts an embodiment of a PLD 100 that is programmed with an 8-bit (8B)/10-bit (10B) coder 102 in accordance with the invention. The architecture of the PLD depicted in FIG. 1 includes logic arrays 104, an embedded array 106, row interconnects 108, column interconnects 110, and input/output elements (IOEs) 112. The logic arrays of the PLD are used to implement general logic including, for example, adders, counters, multiplexers, and state machines. The logic arrays are described in more detail below. The embedded array of the PLD can be used to implement memory functions or complex logic functions such as wide data path manipulation, data transformation, and digital signal processing. The embedded array is described in more detail below. The row and column interconnects connect the logic arrays and embedded array to the input/output elements. The input/output elements provide individually selectable input, output, or bi-directional access between the row and column interconnects and pins on the package of the PLD. The input/output elements may also include some buffer capacity and timing logic to improve input/output performance. An example of a PLD includes the FLEX 10K® embedded programmable logic device series, from ALTERA® Corporation.

The logic arrays 104 are formed from multiple logic array blocks (LABs) 120 and each logic array block includes multiple logical elements (LEs) 122 that are connected to each other by a local interconnect 124. In an embodiment, each logical element is formed from a 4-input look-up table, a programmable flip-flop, and dedicated signal paths for carry and cascade functions. In one application, a logic array block with eight logic elements can be used to generate logic that includes, for example, 8-bit counters, address decoders, or state machines. In another application, multiple logic array blocks can be combined to create larger blocks of logic.

Figure 2:
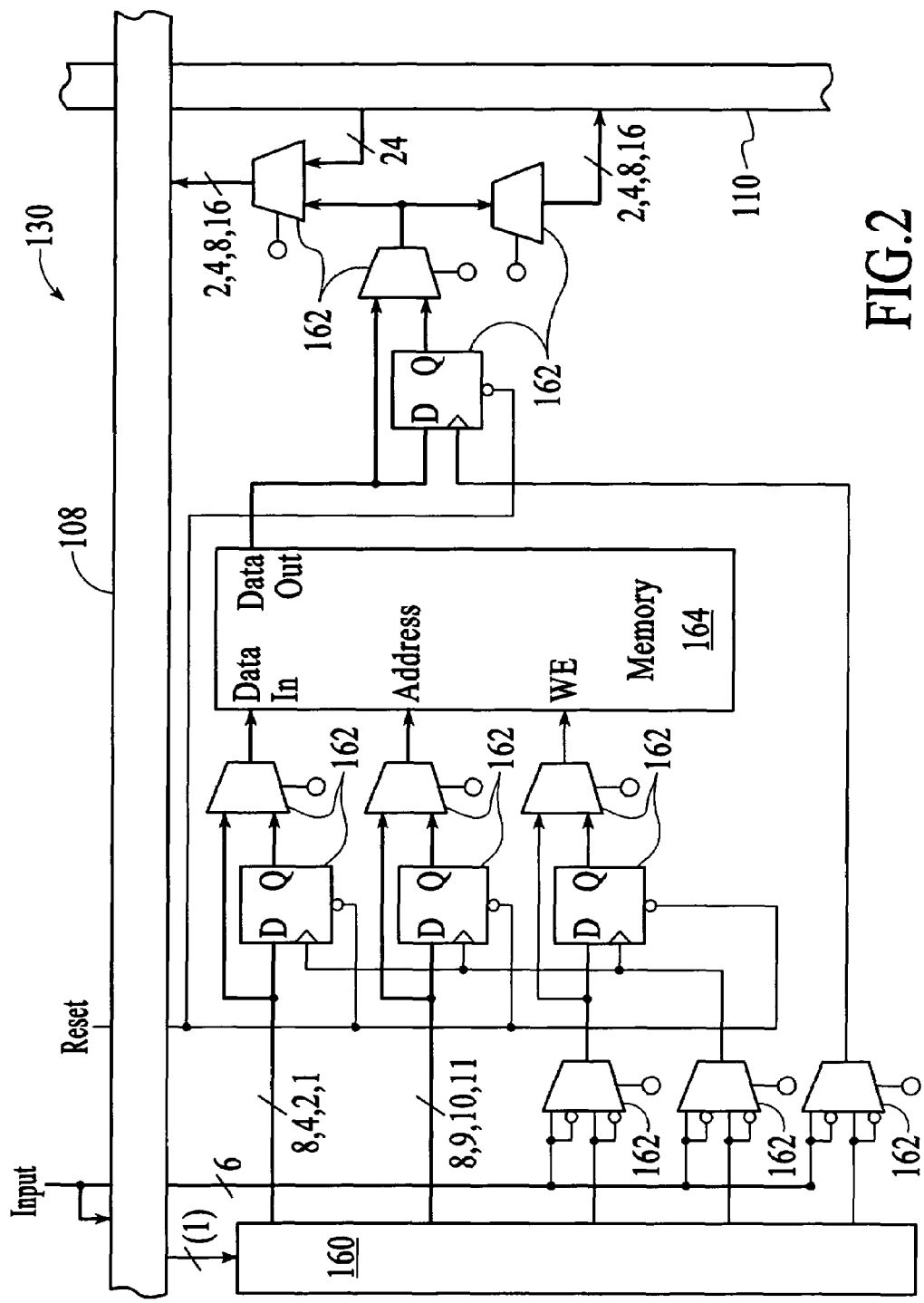
FIG. 2 depicts an expanded view of an embodiment of an embedded array block from FIG. 1.

The embedded array 106 is formed from multiple embedded array blocks 130. The embedded array blocks include memory (e.g., RAM or ROM) and programmable logic. The embedded array blocks can be programmed as memory, logic, or a combination of memory and logic. With respect to memory, an embedded array block can be programmed to provide, for example, RAM, ROM, dual-port RAM, or first-in first-out functionality. With respect to logic, an embedded array block can be programmed to provide more complex functional elements such as state machines, multiplexers, microcontrollers, digital signal processors (DSPs), vectors scalers, and error correction circuits. FIG. 2 depicts an expanded view of an embodiment of an embedded array block 130 from FIG. 1. The embedded array block includes a local interconnect 160, programmable logic 162 (including, for example, multiplexers, demultiplexers, and flip-flops), and memory 164 (e.g., RAM or ROM). In an embodiment, the memory has a capacity of 2,048 bits, which can be partitioned, for example, as 2,048×1, 1,024×2, 512×4, or 256×8. As depicted in FIG. 2, an embedded array block includes both memory and programmable logic as opposed to other FPGA devices that have logic blocks and dedicated RAM blocks which do not include programmable logic. In the embodiment of FIG. 1, there is one embedded array block in each row of the PLD although other configurations are possible.

Logic functions are programmed within the embedded array blocks 130 by programming the circuits of the blocks with a read-only pattern to create a large look-up table. With a look-up table programmed, combinatorial functions can be implemented by looking up the results, rather than by computing the results. Using combinatorial functions to perform certain functions can be faster than using an algorithm implemented in the logic array blocks 120. Additionally, a typical embedded array block of an FPGA has more storage capacity than a typical RAM block of a comparable FPGA that includes multiple RAM blocks distributed throughout the perimeter of an FPGA. Because of the relatively small size of RAM blocks compared to an embedded array block, implementing a large look-up table may require the use of multiple RAM blocks, which requires row/column crossing. Row/column crossing adds complexity and delay to look-up operations. In contrast, because of the relatively large size of embedded array blocks, larger look-up tables can be implemented in a single embedded array block without having to connect multiple embedded array blocks, thereby avoiding the need to cross a row or column to complete encoding or decoding operations.

Although 8B/10B encoding/decoding is well-known in the field of high-speed digital communications, a brief description of 8B/10B encoding/decoding is provided herein. High-speed digital communications networks typically transmit digital data as a series of 1's and 0's. In order for the digital data to be deciphered at the high speeds, it is desirable to transmit a digital data stream with a balanced number of 1's and 0's. A balanced number of 1's and 0's is desired in a digital data stream because a balanced number of 1's and 0's leads to an electronic signal with a balanced number of voltage transitions between a high voltage (typically representing a 1) and a low voltage (typically representing a 0). An electronic signal with a balanced number of voltage transitions is said to be direct current (DC) balanced. A DC balanced signal is important to prevent transformer core saturation and to ensure correct phase locked loop (PLL) operation when coupling a DC signal into an alternating current (AC) medium.

Ethernet is an example of a protocol that is widely used to accomplish digital communications. Some of the higher speed generations of Ethernet require DC balanced bit streams. In particular, one gigabit-per-second Ethernet (GbE) is a generation of Ethernet that requires a DC balanced bit stream. In order to achieve DC balance, GbE utilizes an 8-bit to 10-bit (8B/10B) encoding scheme that is defined by the IEEE in its 802.3 standard (Clause 36, Physical Coding Sublayer (PCS) and Physical Medium Attachment (PMA) sublayer, type 1000BASE-X). Using the 8B/10B encoding scheme, there are 1,024 ($2^{10}$) 10B code-words available to represent 256 ($2^8$) 8B words. From the 1,024 available 10B code-words, two 10B code-words are selected to represent each 8B word. The 10B code-words that are selected to represent each 8B word are the 10B code-words that are balanced with respect to the number of 1's and 0's (that is, each 10B code-word has the same number of 1 s and 0's) or the code-words that are nearly balanced with respect to the number of 1s and 0's (that is, each 10B code-word has six 1's and four 0's or four 1's and six 0's). The selected 10B code-words are then divided into two categories, one category that tends to exhibit a positive DC balance (i.e., those 10B code-words that tend to have more 1's than 0's) and another category that tends to exhibit negative DC balance (i.e., those 10B code-words that tend to have more 0's than 1's). The specific 10B code-words within the two categories of 10B code-words are identified in Clause 36 of the above-identified Ethernet standard.

Upon transmitting a series of 10B code-words across a GbE link, a tally is kept as to whether the pattern of codes is leaning towards too many 1's (RD+ or positive disparity) or leaning towards too many 0's (RD− or negative disparity). The tally is referred to generally as the running disparity, or RD. The RD is used as the basis for determining from which category the next 10B code-word should be selected to represent each subsequent 8B word. For example, if the RD is positive, then a 10B code-word from the category that tends to exhibit more 0's than 1's is selected to represent the next 8B word in the bit stream and if the RD is negative, then a 10B code-word from the category that tends to exhibit more 1's than 0's is selected to represent the next 8B word in the bit stream.

In accordance with the invention, the PLD 100 depicted in FIG. 1 is programmed to implement the functionality of an 8B/10B coder 102, with the logic of the 8B/10B coder being programmed into the embedded array 106 of the PLD instead of into the logic array 104 as is the case in conventional instances of an 8B/10B coder that is programmed into a PLD. In particular, the 8B/10B coder 102 is programmed into one of the embedded array blocks 130 of the embedded array. As used herein, the term "8B/10B coder" includes an 8B/10B encoder, as is used in 8-bit to 10-bit encoding, and/or an 8B/10B decoder, as is used in 10-bit to 8-bit decoding. Additionally, although the invention is described in terms of an 8B/10B coder, it should be understood that the invention can be applied to other x-bit (xB)/y-bit (yB) coders, where x and y are integers.

Programming the 8B/10B coder 102 into an embedded array block 130 of the PLD 100 involves programming the 8B/10B conversions into look-up tables. Standard PLD programming interfaces and PLD programming techniques can be used to program the 8B/10B coder into the embedded array block.

Figure 3:
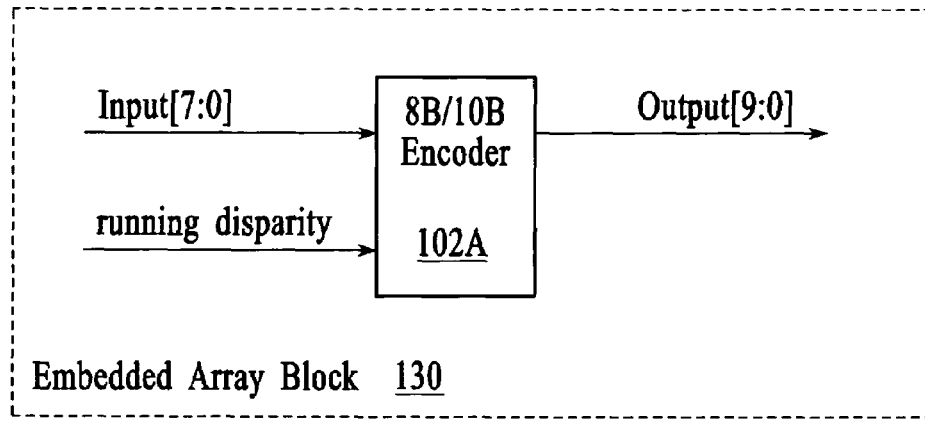
FIG. 3 depicts an embodiment of an 8B/10B encoder that is programmed within an embedded array block of the PLD of FIG. 1.

FIG. 3 depicts an embodiment of an 8B/10B encoder 102A that is programmed within an embedded array block 130 of the PLD 100 of FIG. 1. In an encoding operation, the 8B/10B encoder outputs a 10B code-word in response to an 8B word and the running disparity.

Figure 4:
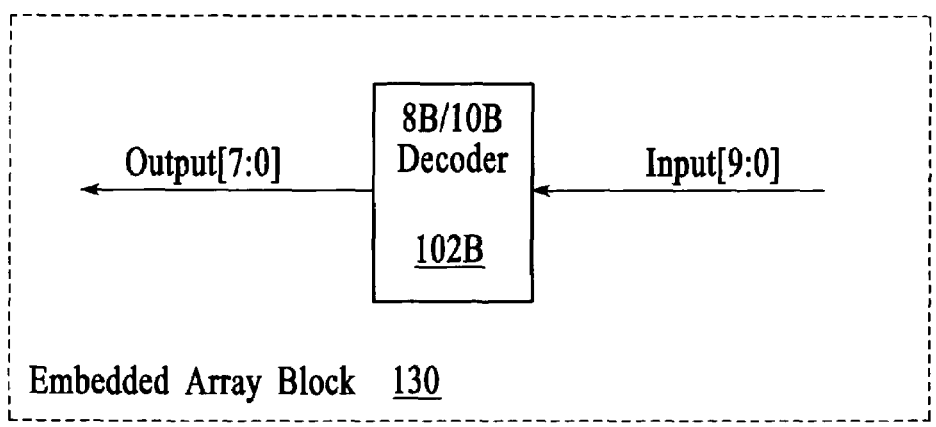
FIG. 4 depicts an embodiment of an 8B/10B decoder that is programmed within an embedded array block of the PLD of FIG. 1.
Figure 5:
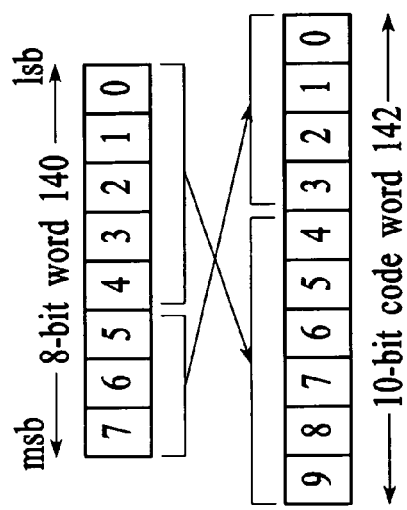
FIG. 5 depicts the correspondence between bits of an 8-bit word and a 10-bit code-word.

FIG. 4 depicts an embodiment of an 8B/10B decoder 102B that is programmed within an embedded array block 130 of the PLD 100 of FIG. 1. In a decoding operation, the 8B/10B decoder outputs an 8B word in response to a 10B code-word.

In 8B/10B encoding, the lower 5 bits of the 8-bit word are encoded into the upper 6 bits of the 10-bit code-word and the upper 3 bits of the 8-bit word are encoded into the lower 4 bits of the 10-bit code-word. The correspondence between bits of an 8-bit word 140 and a 10-bit code-word 142 are depicted in FIG. 4.

Figure 6:
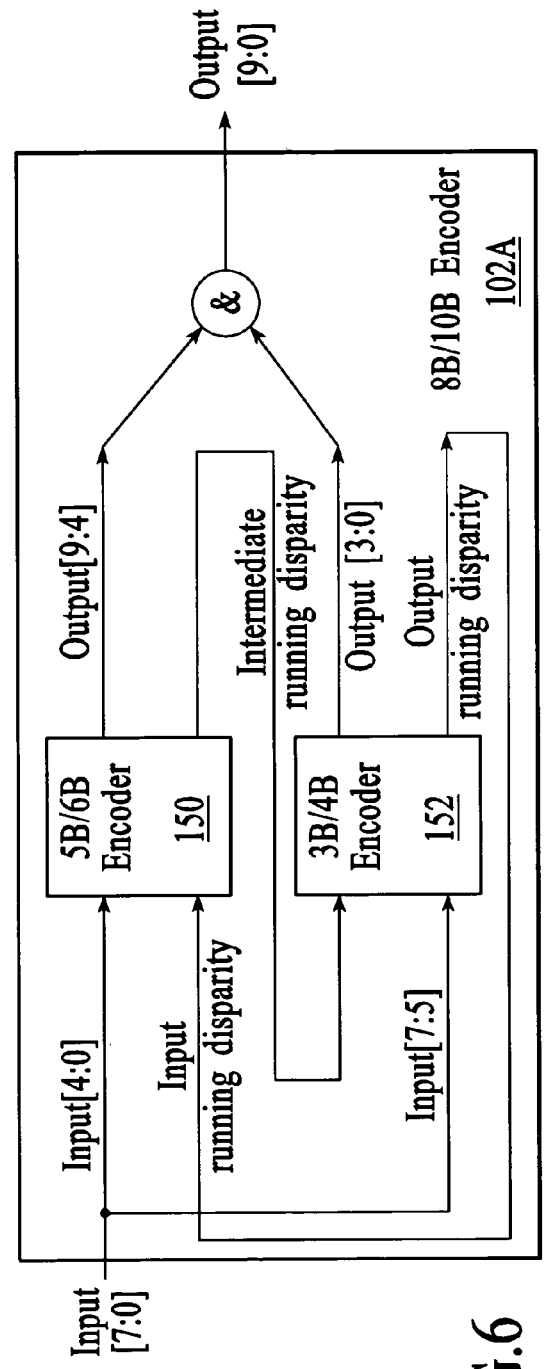
FIG. 6 depicts an embodiment of an 8B/10B encoder programmed into an embedded array block of the PLD that includes a 5B/5B encoder and a 3B/4B encoder.

In an embodiment, the PLD 100 of FIG. 1 is programmed such that the 8B/10B encoding is divided into a two step process. FIG. 6 depicts an embodiment of the 8B/10B encoder 102A of FIG. 2 programmed into an embedded array block 130 of the PLD that includes a 5B/6B encoder 150 and a 3B/4B encoder 152. In operation, the lower 5 bits (i.e., bits 4:0) of the 8-bit word are input to the 5B/6B encoder along with the input running disparity and the upper 6 bits (i.e., bits 9:4) of the 10-bit code-word are output in response. In addition to the upper 6 bits of the 10-bit code-word, the 5B/6B encoder outputs an intermediate running disparity. The intermediate running disparity represents the disparity of the output from the 5B/6B encoder. The upper 3 bits (i.e., bits 7:5) of the 8-bit word are input to the 3B/4B encoder along with the intermediate running disparity and the lower 4 bits (i.e., bits 3:0) of the 10-bit code-word are output in response. The upper 6 bits and lower 4 bits are then combined to produce the 10-bit code-word. In addition to the lower 4 bits of the 10-bit code-word, the 3B/4B encoder outputs a running disparity (the "output" running disparity), which is fed back into the 5B/6B encoder as the "input" running disparity.

The memory requirements for storing the 10B code-words are described now for two cases; 1) the case in which the 8-bit words are encoded directly into the 10-bit code-words, and 2) the case in which the 8B/10B encoding is divided into two steps of 5B/6B encoding and 3B/4B encoding. The memory requirements for the two cases are as follows:

8B/10B Direct Encoding 256 (number of 8-bit combinations) ×

10 (10-bit code-word for every 8-bit word) × 2

(2 10-bit code-words associated with each 8-bit word, one each for positive running disparity and negative running disparity) = 5,120 bits 5B/6B and 3B/4B Encoding Table 1-5B/6B encoding for positive running disparity: 32 (number of 5-bit combinations)×6 (corresponding number of output bits)=192 bits Table 2-5B/6B encoding for negative running disparity: 32 (number of 5-bit combinations)×6 (corresponding number of output bits)=192 bits Table 3-3B/4B encoding for positive running disparity: 8 (number of 3-bit combinations)×4 (corresponding number of output bits)=32 bits Table 4- 3B/4B encoding for negative running disparity: 8 (number of 3-bit combinations)×4 (corresponding number of output bits)=32 bits Total number of bits=192+192+32+32=448 bits In the embodiment of FIG. 6, look-up tables that identify the 5B/6B and 3B/4B conversions are programmed into a single embedded array block of the PLD. In particular, as described above, only 448 bits of memory are needed for the two step process of 8B/10B encoding as opposed to 5,120 bits for the direct 8B/10B encoding. Therefore, in an embodiment of a PLD that includes an embedded array block with at least 448 bits of memory, the storage requirement for the encoding can be met with a single embedded array block. Because the 5B/6B and 3B/4B look-up tables are stored in a single embedded array block, there is no need to cross a row or a column to accomplish the 8B/10B encoding process.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A programmable logic device (PLD) comprising:
   a logic array block; and
   an embedded array block, wherein the embedded array block is programmed to include an xB/yB coder.

2. The PLD of claim 1 wherein the embedded array block comprises memory and programmable logic.

3. The PLD of claim 2 wherein the xB/yB coder includes look-up tables for converting an xB word to a yB word.

4. The PLD of claim 3 wherein the xB/yB coder is programmed to implement the functionality of an 8B/10B coder.

5. The PLD of claim 4 wherein the 8B/10B coder comprises a 5B/6B encoder and a 3B/4B encoder.

6. The PLD of claim 5 wherein an intermediate running disparity is output from one of the encoders and wherein the intermediate running disparity is used by the other encoder.

7. The PLD of claim 5 wherein an intermediate running disparity is output from the 5B/6B encoder and wherein the intermediate running disparity is used by the 3B/4B encoder.

8. An xB/yB coder comprising:
   a programmable logic device (PLD), the PLD comprising;
      a logic array block; and
      an embedded array block, wherein the embedded array block is programmed to include an xB/yB coder.

9. The xB/yB coder of claim 8 wherein the embedded array block comprises memory and programmable logic.

10. The xB/yB coder of claim 9 wherein the xB/yB coder includes look-up tables for converting an xB word to a yB word.

11. The xB/yB coder of claim 10 wherein the xB/yB coder is programmed to implement the functionality of an 8B/10B coder.

12. The xB/yB coder of claim 11 wherein the 8B/10B coder comprises a 5B/6B encoder and a 3B/4B encoder.

13. The xB/yB coder of claim 12 wherein an intermediate running disparity is output from one of the encoders and wherein the intermediate running disparity is used by the other encoder.

14. The xB/yB coder of claim 12 wherein an intermediate running disparity is output from the 5B/6B encoder and wherein the intermediate running disparity is used by the 3B/4B encoder.

15. An xB/yB coder comprising:
   a programmable logic device (PLD), the PLD comprising;
      logic array blocks; and
      embedded array blocks, each embedded array block having memory and programmable logic, wherein an xB/yB coder is programmed within at least one of the embedded array blocks.

16. The xB/yB coder of claim 15 wherein the xB/yB coder includes look-up tables for converting an xB word to a yB word.

17. The xB/yB coder of claim 16 wherein the xB/yB coder is programmed to implement the functionality of an 8B/10B coder.

18. The xB/yB coder of claim 17 wherein the 8B/10B coder comprises a 5B/6B encoder and a 3B/4B encoder.

19. The xB/yB coder of claim 18 wherein an intermediate running disparity is output from one of the encoders and wherein the intermediate running disparity is used by the other encoder.

20. The xB/yB coder of claim 18 wherein an intermediate running disparity is output from the 5B/6B encoder and wherein the intermediate running disparity is used by the 3B/4B encoder.

* * * * *